(12) United States Patent
Maruyama et al.

(10) Patent No.: US 8,517,544 B2
(45) Date of Patent: Aug. 27, 2013

(54) SUBSTRATE CONNECTION STRUCTURE AND PROJECTOR

(75) Inventors: Yasushi Maruyama, Shiojiri (JP); Susumu Takatsu, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 273 days.

(21) Appl. No.: 13/048,368

(22) Filed: Mar. 15, 2011

(65) Prior Publication Data

US 2011/0234983 A1    Sep. 29, 2011

(30) Foreign Application Priority Data

Mar. 23, 2010    (JP) .................................. 2010-065860

(51) Int. Cl.
    *G03B 21/00*    (2006.01)

(52) U.S. Cl.
    USPC ................. 353/122; 353/30; 353/31; 353/34; 353/98; 349/5; 349/58; 345/87

(58) Field of Classification Search
    USPC ............... 353/30, 31, 34, 54, 56, 98, 99, 119, 353/122; 361/679.54, 679.59, 748, 749, 361/785, 789; 349/5, 7–9, 38–39, 58, 139, 349/143, 149–152; 438/106–127, 455–459; 359/237, 242, 244, 245
    See application file for complete search history.

(56) References Cited

U.S. PATENT DOCUMENTS

| | | | |
|---|---|---|---|
| 6,128,063 A * | 10/2000 | Uchiyama et al. | 349/150 |
| 6,201,689 B1 * | 3/2001 | Miyasyo | 361/679.54 |
| 6,232,142 B1 * | 5/2001 | Yasukawa | 438/69 |
| 6,498,672 B2 * | 12/2002 | Saitoh | 359/245 |
| 7,263,269 B2 * | 8/2007 | Miyashita | 385/147 |
| 8,319,109 B2 | 11/2012 | Ishii | |
| 2004/0239886 A1 * | 12/2004 | Yanagisawa | 353/34 |
| 2009/0219600 A1 * | 9/2009 | Gally et al. | 359/245 |

FOREIGN PATENT DOCUMENTS

| | | |
|---|---|---|
| CN | 101551533 A | 10/2009 |
| JP | A-2004-117791 | 4/2004 |
| JP | A-2007-83707 | 4/2007 |

\* cited by examiner

*Primary Examiner* — Georgia Y Epps
*Assistant Examiner* — Sultan Chowdhury
(74) *Attorney, Agent, or Firm* — Oliff & Berridge, PLC

(57) ABSTRACT

A substrate connection structure between a plurality of light modulating devices each having a flexible substrate extending in a predetermined direction and a circuit substrate connected with the light modulating devices, wherein the light modulating devices are arranged so that the direction of one flexible substrate extending from at least one of the light modulating devices is different from the directions of the other flexible substrates extending from the other light modulating devices, the substrate connection structure includes: a relay substrate which is connected with the one flexible substrate; and an extension flexible substrate which is connected with the relay substrate.

7 Claims, 4 Drawing Sheets

SUBSTRATE CONNECTION STRUCTURE AND PROJECTOR

BACKGROUND

1. Technical Field

The present invention relates to a substrate connection structure and a projector having the substrate connection structure.

2. Related Art

In the related art, there has been known a projector in which a light flux emitted from a light source is split into three color lights, each split color light is modulated by a light modulating device, an optical image emitted from each light modulating device is composed by a color composition optical device, and the composed optical image is projected as image light. Further, the light modulating device includes a flexible substrate and is connected to a driving circuit substrate for driving the light modulating device.

Here, in a case where three light modulating devices are disposed corresponding to the color composition optical device, the direction of a flexible substrate included in one light modulating device may be opposite to the direction of flexible substrates included in the other two light modulating devices, for example, by a difference in arrangement positions. Thus, it may be necessary to match the flexible substrate having a different direction with the directions of the other flexible substrates and to make an electrode surface thereof reverse. In such a case, the directions are matched by bending the flexible substrates and by twisting 180 degrees, thereby making the electrode surface reverse. In JP-A-2007-83707, a technique of twisting the flexible substrates for connection is disclosed.

However, in a case where the flexible substrate having the different direction is bent and twisted so that the directions of the other flexible substrates are matched and the electrode surface thereof is reversed, stress in a twisting direction is applied to the flexible substrate, and thus, the flexible substrate may be fractured (specifically, a wiring formed on the flexible substrate may be fractured).

Accordingly, in a case where a plurality of light modulating devices are arranged, there is a demand for a substrate connection structure and a projector in which a flexible substrate having a different direction is matched with the directions of the other flexible substrates without being twisted and an electrode surface thereof can be reversed.

SUMMARY

An advantage of some aspects of the invention is to solve at least a part of the problems described above and the invention can be implemented as the following forms or application examples.

APPLICATION EXAMPLE 1

According to this application example, there is provided a substrate connection structure between a plurality of light modulating devices each having a flexible substrate extending in a predetermined direction and a circuit substrate connected with the light modulating devices. Here, the light modulating devices are arranged so that the direction of one flexible substrate extending from at least one of the light modulating devices is different from the directions of the other flexible substrates extending from the other light modulating devices. The substrate connection structure includes a relay substrate which is connected with the one flexible substrate; and an extension flexible substrate which is connected with the relay substrate.

According to such a substrate connection structure, it is possible to match one flexible substrate having a different direction with the directions of the other flexible substrates by bending the one flexible substrate in an approximate U shape, for example. In this case, as the one flexible substrate is bent in the approximate U shape, the length of one flexible substrate is shortened compared with the lengths of the other flexible substrates. However, as the one flexible substrate is connected to the relay substrate and the extension flexible substrate, it is possible to correct the shortened length and to make the length equal to the lengths of the other flexible substrates.

APPLICATION EXAMPLE 2

In the substrate connection structure according to the above application example, the relay substrate may include a first connector which is connected with the one flexible substrate and holds the one flexible substrate; a second connector which is connected with the extension flexible substrate and holds the extension flexible substrate; and a relay substrate main body on which a wiring which conductively connects the first connector and the second connector is formed. Here, the first connector may be installed on one surface of the relay substrate main body and the second connector may be installed on the other surface of the relay substrate main body.

According to such a substrate connection structure, even in a case where the direction of an electrode surface becomes reversed when the flexible substrate is bent, the direction of the electrode surface can match with the direction before the direction of the electrode surface is bent (directions of the electrode surfaces of the other flexible substrates) by the relay substrate. Accordingly, it is not necessary to twist the flexible substrate, and thus, it is possible to prevent fracture (specifically, fracture of the wiring formed on the flexible substrate is fractured) by stress due to twisting. Further, the first connector and the second connector can be used as connectors having the same contact structure, and thus, it is possible to prevent installation errors in an assembly process, compared with a case where connectors having different contact structures are used.

APPLICATION EXAMPLE 3

In the substrate connection structure according to the above application example, the relay substrate main body may be formed of a rigid substrate.

According to such a substrate connection structure, as the relay substrate main body is formed of the rigid substrate and has stiffness compared with a case where it is formed of a flexible substrate, problems (separation or the like) with the relay substrate main body hardly occur, even though the first connector and the second connector are installed (surface-mounted) on the surface of the relay substrate main body. Thus, it is possible to enhance connection workability and to maintain a preferable connection state.

APPLICATION EXAMPLE 4

In the substrate connection structure according to the above application example, the circuit substrate may include a plurality of third connectors which is respectively connected with the extension flexible substrate and the other flexible substrates, and the third connectors may be installed on the same surface of the circuit substrate.

According to such a substrate connection structure, as the plurality of third connectors is installed on the same surface of the circuit substrate, is connected to the extension flexible substrate, and is connected to the flexible substrates having different light modulating devices, respectively. Thus, it is possible to efficiently connect the plurality of flexible substrates to the corresponding third connectors, respectively, compared with a case where the third connectors are installed on different surfaces.

APPLICATION EXAMPLE 5

According to this application example, there is provided a projector including: any one of the above-described substrate connection structures; and a color composition optical device which composes optical images emitted from the light modulating devices and emits the composed result.

According to such a projector, even though the direction of one flexible substrate is different from the directions of the other flexible substrates in a case where the plurality of light modulating devices are arranged, it is possible to enhance connection workability, to maintain a preferable electric connection state, and to perform a stable projection, by the above-described substrate connection structure.

APPLICATION EXAMPLE 6

According to this application example, there is provided a manufacturing method of a projector, including: preparing a plurality of light modulating devices each having a flexible substrate extending in a predetermined direction; preparing a circuit substrate connected with the light modulating devices; arranging the light modulating devices so that the direction of one flexible substrate extending from at least one of the light modulating devices is different from the directions of the other flexible substrates extending from the other light modulating devices, connecting a relay substrate with the one flexible substrate; connecting an extension flexible substrate with the relay substrate; and connecting the flexible substrates and the relay substrate with the circuit substrate.

According to such a projector manufacturing method, it is possible to match one flexible substrate having a different direction with the directions of the other flexible substrates by bending the one flexible substrate in the approximate U shape, for example. In this case, as the one flexible substrate is bent in the approximate U shape, the length of one flexible substrate is shortened compared with the lengths of the other flexible substrates. However, as the one flexible substrate is connected to the relay substrate and the extension flexible substrate, it is possible to correct the shortened length and to make the length equal to the lengths of the other flexible substrates. In the substrate connection structure having such a configuration, the lengths of the flexible substrates extending from the respective light modulating devices are equal to each other, thereby easily obtaining connection with the circuit substrate.

APPLICATION EXAMPLE 7

In the projector manufacturing method according to the above application example, the relay substrate includes a first connector which is connected with the one flexible substrate and holds the one flexible substrate; a second connector which is connected with the extension flexible substrate and holds the extension flexible substrate; and a relay substrate main body on which a wiring which conductively connects the first connector and the second connector is formed. The method further includes installing the first connector on one surface of the relay substrate main body; and installing the second connector on the other surface of the relay substrate main body.

According to such a projector manufacturing method, even in a case where the direction of an electrode surface becomes reversed when the flexible substrate is bent, the direction of the electrode surface can be made to match with the direction before the direction of the electrode surface is bent (directions of the electrode surfaces of the other flexible substrates), by the relay substrate. Accordingly, it is not necessary to twist the flexible substrate, and thus, it is possible to prevent fracture (specifically, the wiring formed on the flexible substrate is fractured) by stress due to twisting. Further, the first connector and the second connector can be used as connectors having the same contact structure, and thus, it is possible to prevent installation errors in an assembly process, compared with a case where connectors having different contact structures are used.

APPLICATION EXAMPLE 8

In the projector manufacturing method according to the above application example, the method further includes forming the relay substrate main body of a rigid substrate.

According to such a projector manufacturing method, as the relay substrate main body is formed of the rigid substrate and has stiffness compared with a case where it is formed of a flexible substrate, problems (separation or the like) with the relay substrate main body hardly occur, even though the first connector and the second connector are installed (surface-mounted) on the surface of the relay substrate main body. Thus, it is possible to enhance connection workability and to maintain a preferable connection state.

APPLICATION EXAMPLE 9

The projector manufacturing method according to the above application example may further include installing a plurality of third connectors which is respectively connected with the extension flexible substrate and the other flexible substrates, on the same surface of the circuit substrate.

According to such a projector manufacturing method, the plurality of third connectors is installed on the same surface of the circuit substrate, is connected to the extension flexible substrate, and is connected to the flexible substrates having different light modulating device, respectively. Thus, it is possible to efficiently connect the plurality of flexible substrates to the corresponding third connectors, respectively, compared with a case where the third connectors are installed on different surfaces.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the accompanying drawings.

Embodiment

Figure 1:
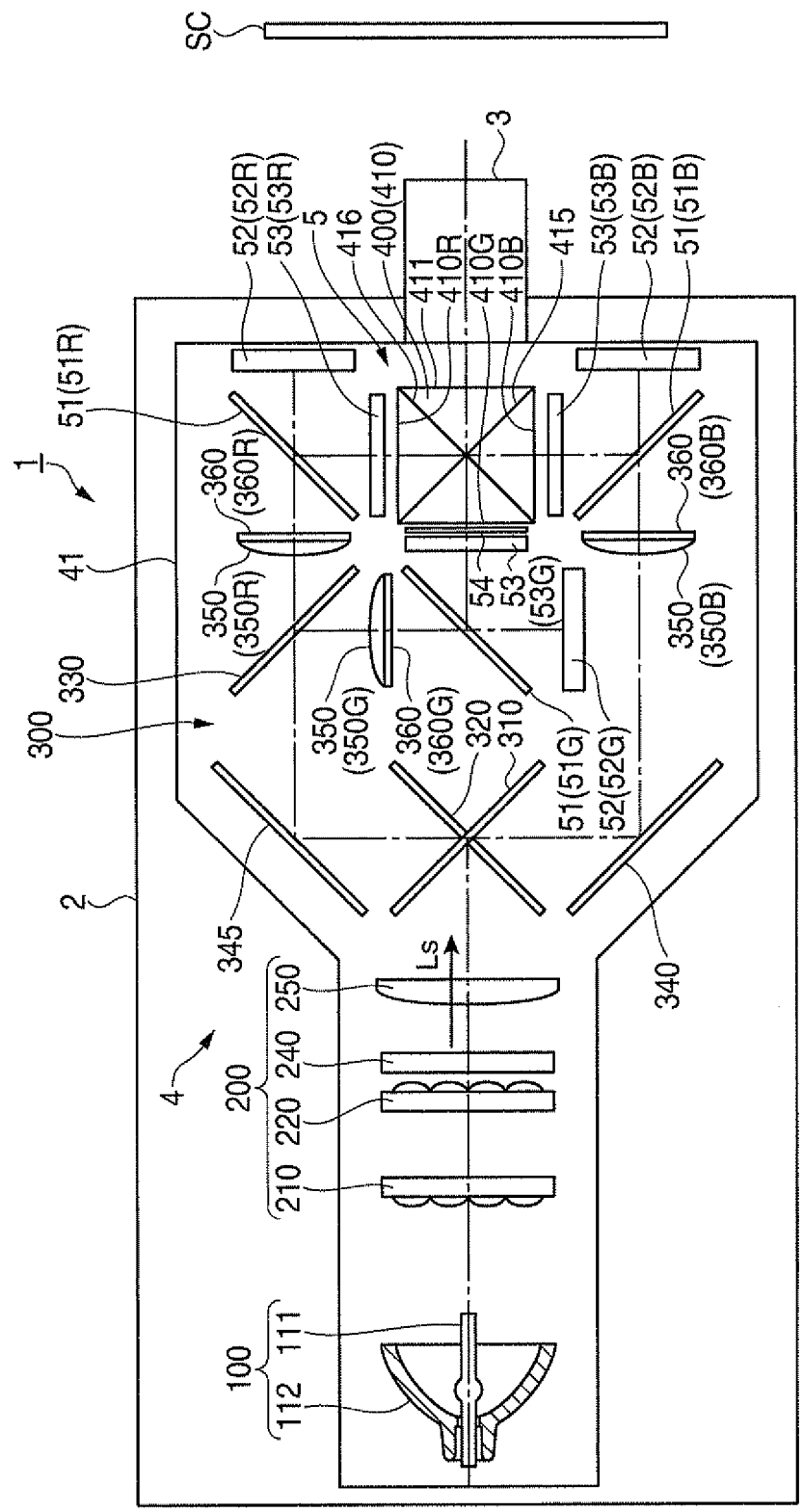
FIG. 1 is a diagram schematically illustrating a configuration of a projector according to an embodiment of the invention.

FIG. 1 is a diagram schematically illustrating a configuration of a projector 1 according to an embodiment of the invention.

The projector 1 according to this embodiment includes an external housing 2 which forms an outer appearance, a projection lens 3, an optical unit 4, or the like which acts as a projection optical device. The optical unit 4 includes three reflective light modulating devices 52 (52R, 52G and 52B) corresponding to red (R) light, green (G) light, and blue (B) light, respectively. The projector 1 composes optical images, which are generated by modulating a light flux emitted from a light source device 100 on the basis of image signals by respective reflective light modulating devices 52R, 52G, and 52B, using a color composition optical device 400, and then projects the composed image light onto a screen SC or the like for enlargement.

In the external housing 2 of the projector 1, a cooling unit which includes a cooling fan, for example, which cools each component, a power unit which supplies power to each component, a control device which controls each component, and the like are accommodated, which are not specifically shown.

The optical unit 4 of the projector 1 includes the light source device 100, an illumination optical device 200, a color splitting optical device 300, collimating lenses 350, phase difference plates 360, an optical device 5, a color composition optical device 400, and an optical part housing 41 which accommodates the respective members therein.

The light source device 100 includes a light source lamp 111, a reflector 112, and the like. The radial light flux emitted from the light source lamp 111 is reflected by the reflector 112 and becomes approximately a parallel light flux, and then is directed to the illumination optical device 200. In this embodiment, a discharge lamp such as an extra high pressure mercury lamp is used as the light source lamp 111.

The illumination optical device 200 includes a first lens array 210, a second lens array 220, a polarization conversion element 240, and a superposing lens 250.

The first lens array 210 and the second lens array 220 are formed by arranging small lenses in a matrix shape. The light flux emitted from the light source device 100 is split into a plurality of small partial light fluxes by the first lens array 210, and the respective partial light fluxes are superposed on surfaces of three reflective light modulating devices 52 (52R, 52G, and 52B) which are illumination targets by the second lens array 220 and the superposing lens 250.

The polarization conversion element 240 has a function of aligning the light flux of random polarization as one directional polarization light. Further, in this embodiment, the polarization conversion element 240 aligns the light flux as an S polarization light in which loss of the light flux in the color splitting optical device 300 is small.

The color splitting optical device 300 has a function of splitting a light flux Ls (S polarization light) emitted from the illumination optical device 200 into three color lights of R light, G light and B light. Further, the color splitting optical device 300 includes a B light reflection dichroic mirror 310, an RG light reflection dichroic mirror 320, a G light reflection dichroic mirror 330, and reflection mirrors 340 and 345.

A B light component in the light flux emitted from the illumination optical device 200 is reflected by the B light reflection dichroic mirror 310, is reflected again by the reflection mirror 340, and then reaches a collimating lens 350B. On the other hand, R light and G light components in the light flux emitted from the illumination optical device 200 are reflected by the RG light reflection dichroic mirror 320, are reflected again by the reflection mirror 345, and then reach the G light reflection dichroic mirror 330. The G light component is reflected by the G light reflection dichroic mirror 330 and reaches a collimating lens 350G, and the R light component passes through the G light reflection dichroic mirror 330 and then reaches a collimating lens 350R.

The collimating lenses 350R, 350G, and 350B convert the plurality of partial light fluxes emitted from the illumination optical devices 200 into approximately parallel light fluxes, and illuminate the corresponding reflective light modulating devices 52R, 52G, and 52B. Phase difference plates 360R, 360G, and 360B which are λ/2 plates convert the respective color lights (S polarization light) which pass through the collimating lenses 350R, 350G and 350B into P polarization lights.

The optical device 5 includes three wire grid type polarization split elements 51, three reflective light modulating devices 52, three polarization plates 53, and a cross dichroic prism 410 which is the color composite optical device 400. In the three wire grid type polarization split elements 51, an R light polarization conversion element is referred to as 51R, a G light polarization conversion element is referred to as 51G, and a B light polarization conversion element is referred to as 51B. This is similarly applied to the reflective light modulating devices 52 and the polarization plates 53.

The polarization split elements 51 are of a wire grid type, and are formed with aluminum ribs (not shown) on a surface of a glass substrate (not shown) with a line width of several tens of nanometers and a pitch of a hundred and several tens of nanometers, for example. Further, the aluminum ribs have a function of transmitting a polarization component (P polarization light in this embodiment) perpendicular thereto and reflecting a polarization component (S polarization light in this embodiment) parallel thereto.

The polarization split element 51G is disposed at an incline at an angle of approximately 45° with respect to an optical axis of incident color light. The polarization split element 51G transmits the G light (P polarization light) emitted from the phase difference plate 360G so that the G light (P polarization light) is emitted to the reflective light modulating device 52G. Then, the polarization split element 51G reflects the S polarization light in the G light which is modulated and reflected by the reflective light modulating device 52G, and emits the S polarization light to the polarization plate 53G as an optical image. The S polarization light which passes through the polarization plate 53G is converted into the P polarization light by the phase difference plate 54 which is a λ/2 plate. The polarization split element 51G may transmit the S polarization light and reflect the P polarization light. However, a configuration in which the polarization split element 51G transmits the P polarization light and reflects the S polarization light there is little light loss, like the embodiment.

The polarization split elements 51R and 51B are formed in a similar way to the polarization split element 51G, and have the same function. Further, the polarization split elements 51R and 51B transmit the R light (P polarization light) and B light (P polarization light) emitted from the phase difference plates 360R and 360B and emit the R light (P polarization light) and B light (P polarization light) to the reflective light modulating devices 52R and 52B, respectively. The polarization split elements 51R and 51B reflect the S polarization light among the R light and B light which are modulated and reflected by the reflective light modulating devices 52R and 52B, and emit the S polarization light to the polarization plates 53R and 53B as optical images, respectively. Polarization conversion into the P polarization light is not performed to the B light and the R light.

The reflective light modulating devices 52R, 52G and 52B have a structure in which a liquid crystal layer is interposed between facing substrates. Reflection pixel electrodes to which switching elements are connected are disposed in a matrix shape on one substrate. An opposite electrode is formed in the other substrate (transparent substrate). In the reflective light modulating devices 52R, 52G and 52B, the liquid crystal layer is driven due to a voltage applied between the reflection pixel electrode and the opposite electrode, and the R light, the G light and the B light which pass through the polarization split elements 51R, 51G and 51B, respectively, are modulated on the basis of the applied voltage (image signal).

The three polarization plates 53 transmit a polarization light which has approximately the same polarization direction as a polarization direction of the polarization light which is modulated by each reflective light modulating device 52 and is reflected by each polarization split element 51. A configuration may be employed in which the polarization components are removed by the polarization plates 53 even in a case where polarization components other than desired linear polarization lights are reflected by the polarization split elements 51, by using both of the polarization split elements 51 and the polarization plates 53. The modulation light which passes through the respective polarization plates 53 (53R, 53G, and 53B) is incident to corresponding incident surfaces 410R, 410G, and 410B in the cross dichroic prism 410.

The cross dichroic prism 410 is formed in a rectangular column shape of an approximately square section by pasting four prisms of a triangular column shape, and has dielectric multilayers 415 and 416 along pasting surfaces of an X shape. The dielectric multilayer 415 transmits the G light and reflects the R light, and the dielectric multilayer 416 transmits the G light and reflects the B light. Through this operation, the cross dichroic prism 410 composes the modulation light (optical images) incident from the incident surfaces 410R, 410G, and 410B, forms image light indicating color images, and then emits the formed image light to the projection lens 3 from an emitting surface 411. The projection lens 3 which is the projection optical device projects the image lights exiting from the emitting surface 411 of the cross dichroic prism 410 onto the screen SC or the like for enlargement.

Figure 2:
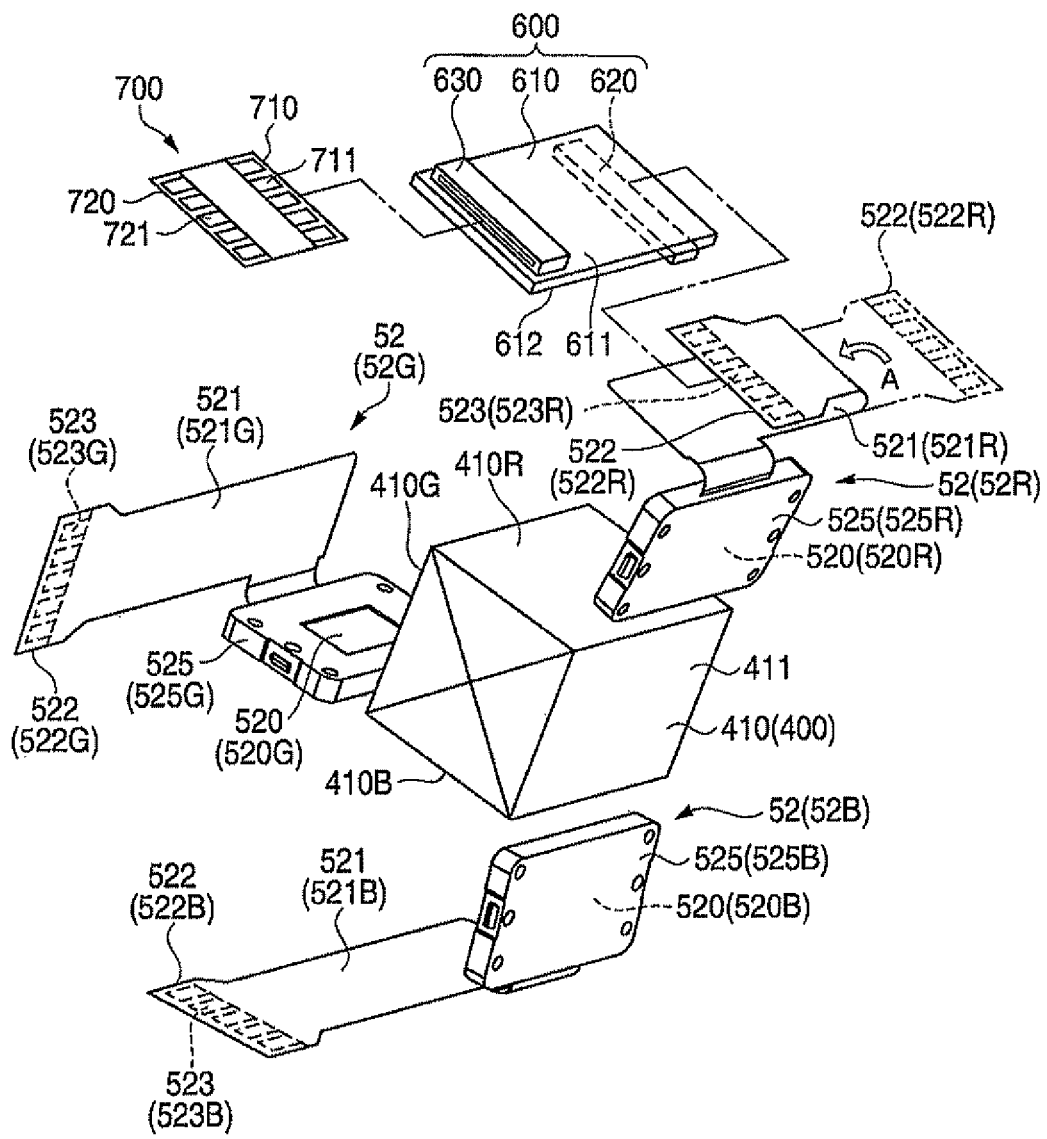
FIG. 2 is a diagram illustrating an exploded perspective view illustrating members which form a substrate connection structure.
Figure 3:
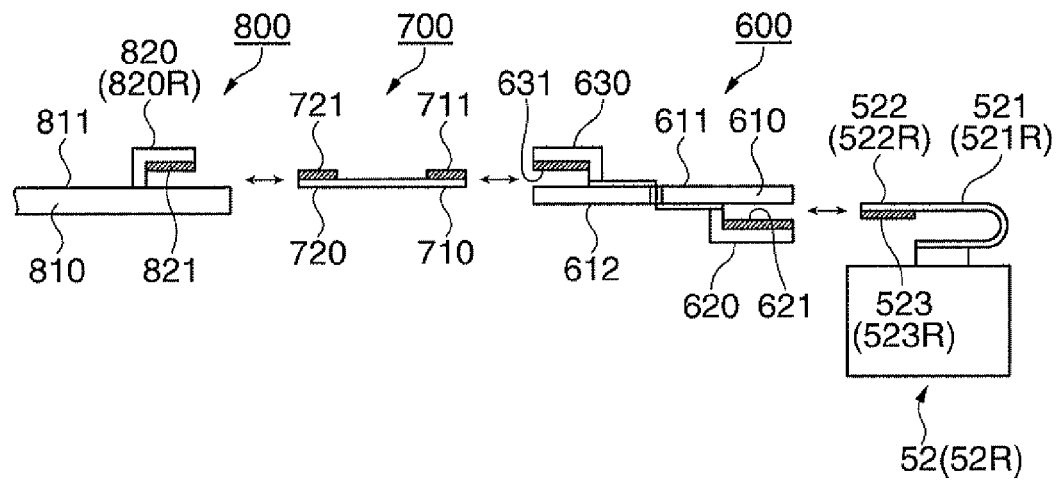
FIG. 3 is a diagram illustrating a cross-sectional view illustrating the members which form the substrate connection structure.
Figure 4:
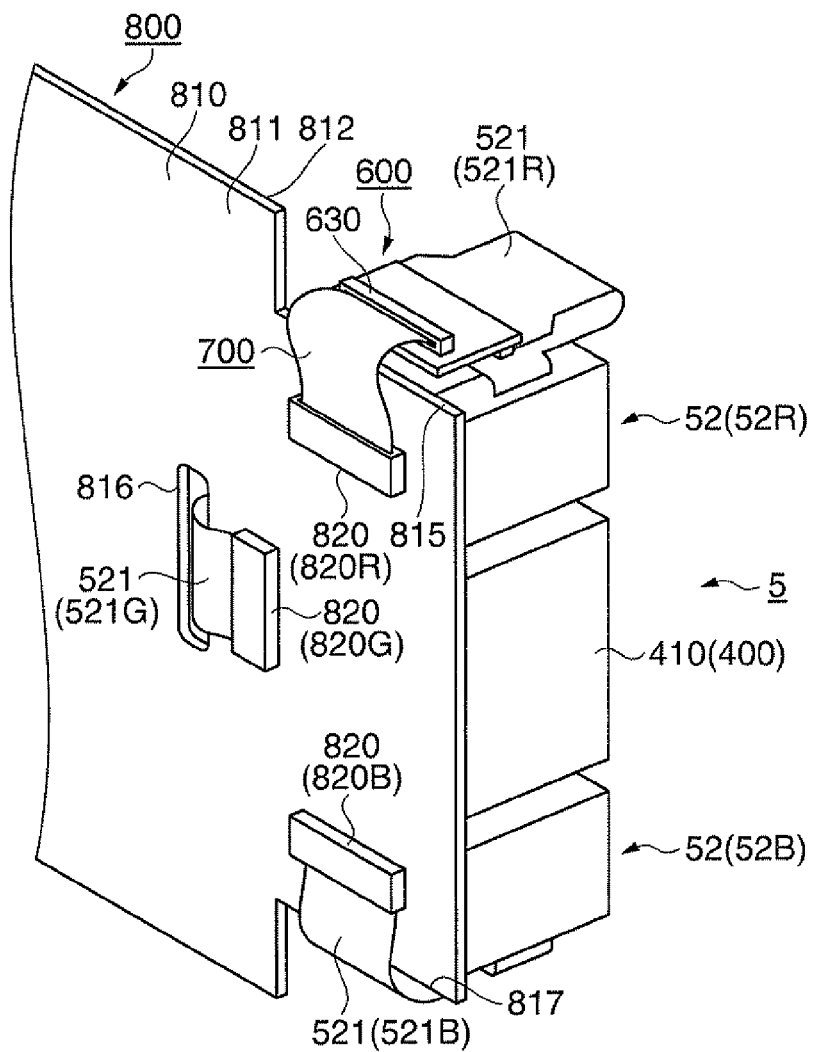
FIG. 4 is a perspective view schematically illustrating a state where a flexible substrate of a reflective light modulating device is connected to a driving circuit substrate.

FIG. 2 is an exploded perspective view illustrating members which form the substrate connection structure. FIG. 3 is a diagram schematically illustrating a cross-section of the members which form the substrate connection structure. FIG. 4 is a perspective view schematically illustrating a state where flexible substrates (FPCs 521) of the reflective light modulating device 52 are connected to a driving circuit substrate 800. FIG. 2 is a perspective view of the optical device 5, in which the reflective light modulating devices 52R, 52G and 52B are disposed in predetermined positions around the cross dichroic prism 410. The polarization light split elements 51R, 51G and 51B which form the optical device 5 and the polarization plates 53R, 53G and 53B are not shown in FIG. 2.

As shown in FIG. 2, each of three reflective light modulating devices 52 includes a reflective liquid crystal display panel 520 which is a device main body, and an FPC 521 which is a flexible substrate, and a holding frame 525. The FPC 521 electrically connects a driving circuit substrate 800 which forms the above-described control device and the reflective liquid crystal display panel 520. The FPC 521 has an approximately L-bent shape. One end side of the FPC 521 is fixed and electrically connected to a connection terminal section (not shown) which is formed near an end portion corresponding to a long side of the reflective liquid crystal display panel 520, having a rectangular shape when seen from a planar view. The other side thereof is electrically connected to the driving circuit substrate 800 (refer to FIG. 4).

As shown in FIG. 2, in a case where the reflective light modulating devices 52R, 52G and 52B are disposed in the predetermined positions around the cross dichroic prism 410 in consideration of light paths of respective color lights formed in the color splitting optical device 300, the direction of an FPC 521R of the R light reflective light modulating device 52R is different from the directions of FPCs 521G and 521B of the G light and B light reflective light modulating devices 52G and 52B, and specifically, has a different direction arrangement by 180° in this embodiment. In this embodiment, the substrate connection structure is applied to the FPC 521R.

The substrate connection structure in this embodiment includes a relay substrate 600 and an extension FPC 700 which is an extension flexible substrate. The relay substrate 600 is connected to the FPC 521R and is connected to the extension FPC 700. Further, the substrate connection structure in this embodiment includes the driving circuit substrate 800. Further, the extension FPC 700 is connected to the driving circuit substrate 800.

In the substrate connection structure, the FPC 521R is bent in a U shape (indicated by an arrow A in FIG. 2), and the direction of the FPC 521R matches with the directions of the FPCs 521G and 521B. Further, in the substrate connection structure, when the FPC 521R is bent in the U shape, the direction of an electrode surface 523R of the connection terminal section 522R becomes reversed (see FIG. 2). The direction of an electrode surface 523R matches with the directions of the electrode surfaces 523G and 523B of the connection terminal sections 522G and 522B of the FPCs 521G and 521B (in this embodiment, is directed outward with reference to the cross dichroic prism 410). In FIG. 2, the electrode surfaces 523R, 523G and 523B of the connection terminal sections 522R, 522G and 522B are schematically shown for ease of description, and thus, the number, shape and the like of the electrodes may actually differ.

As shown in FIGS. 2 to 4, the relay substrate 600 is a substrate which connects (relays) the FPC 5218 and the extension FPC 700. Further, the relay substrate 600 corrects the length when the FPC 521R is bent in the U shape. Further, the relay substrate 600 makes the electrode surface 523R of the connection terminal section 522R of the FPC 521R reverse (to match with the directions of the electrode surfaces 523G and 523B of the other connection terminal sections 522G and 522B).

The relay substrate 600 is formed of a rigid substrate which forms a rectangular shape when seen from a planar view. The relay substrate 600 includes a relay substrate main body 610, a first connector 620 and a second connector 630. The first connector 620 and the second connector 630 use the same mechanical specification. The first connector 620 and the second connector 630 have contact sections 621 and 631 on sides opposite to the relay substrate main body 610, respectively, as shown in FIG. 3.

As shown in FIGS. 2 and 3, the first connector 620 is disposed (surface-mounted) on a rear surface 612 of one end portion of the relay substrate main body 610. Further, the first connector 620 holds the connection terminal section 522R as the connection terminal section 522R of the FPC 521R which is bent in the U shape is inserted into the first connector 620 so that the electrode surface 523R and the contact section 621 are (conductively) connected.

The second connector 630 is disposed (surface-mounted) on a surface 611 of the other end portion of the relay substrate main body 610. Further, the second connector 630 holds the connection terminal section 710 as the connection terminal section 710 of the extension FPC 700 which will be described later is inserted into the second connector 630 so that an electrode surface 711 and the contact section 631 are (conductively) connected. The relay substrate main body 610 is formed by electrically connecting a wiring which (conductively) connects the first connector 620 and the second connector 630 to the surface 611 from the rear surface 612.

The extension FPC 700 is a substrate which connects the relay substrate 600 and the driving circuit substrate 800. The extension FPC 700 maintains a state where the electrode surface 523R of the connection terminal section 522R of the FPC 521R is reversed by the relay substrate 600 for connection to the driving circuit substrate 800. The extension FPC 700 is formed of a flexible substrate which forms a rectangular shape when seen from a planar view. The extension FPC 700 includes the connection terminal section 710 formed in one end portion and a connection terminal section 720 formed in the other end portion thereof. Further, the extension FPC 700 is connected with and held in the second connector 630 of the relay substrate 600 as one connection terminal section 710 is inserted into the second connector 630 of the relay substrate 600. Further, the extension FPC 700 is connected with and held in a third connector 820R of the driving circuit substrate 800 as the other connection terminal section 720 is inserted into the third connector 820R of the driving circuit substrate 800.

The driving circuit substrate 800 is a substrate which drives the reflective light modulating device 52 (reflective liquid crystal display panel 520), which applies (outputs) voltage (image signal or the like) to the reflective liquid crystal display panel 520 through the FPC 521. The reflective liquid crystal display panel 520 to which the voltage (image signal) is applied (input) modulates and reflects the polarization direction of the incident light flux, as the orientation state of the liquid crystal thereof is controlled.

The driving circuit substrate 800 is formed of a rigid substrate. The driving circuit substrate 800 includes a driving circuit substrate main body 810 and three third connectors 820 (820R, 820G and 820B). The third connector 820 uses the same mechanical specification as that of the first connector 620 and the second connector 630 which form the relay device 600. Accordingly, the third connector 820 is formed with a contact section 821 on a side opposite to one surface 811 of the driving circuit substrate main body 810, as shown in FIG. 3.

As shown in FIG. 4, three third connectors 820 are disposed (surface-mounted) in predetermined portions, respectively, on one surface 811 of the driving circuit substrate main body 810. Further, in the driving circuit substrate main body 810, a cutout section 815 is formed corresponding to a third connector 820R, a through hole 816 is formed corresponding to a third connector 820G, and a cutout section 817 is formed corresponding to a third connector 820B.

As shown in FIG. 4, the optical device 5 is disposed on the side of the other surface 812 of the driving circuit substrate 800. The connection terminal section 522 of the FPC 521 of the reflective light modulating device 52 (here, the connection terminal section 720 of the extension FPC 700 in the FPC 521R) is connected to the third connector 820 which is extended from the other surface 812 of the driving circuit substrate 800 and is disposed on one surface side 811.

Specifically, the FPC 521R is connected to the third connector 820R as the connection terminal section 720 of the extension FPC 700 is inserted into the third connector 820R through the cutout section 815 as described above. At this time, the electrode surface 721 of the connection terminal section 720 is (conductively) connected to the contact section 821 of the third connector 820R. Further, the FPC 521G is inserted into and connected to the third connector 820G passing through the through hole 816. At this time, the electrode surface 523G of the connection terminal section 522G of the FPC 521G is (conductively) connected to the contact section 821 of the third connector 820G. Further, the FPC 521B is inserted into and connected to the third connector 820B through the cutout section 817. At this time, the electrode surface 523B of the connection terminal section 522B of the FPC 521B is (conductively) connected to the contact section 821 of the third connector 820B.

According to the above-described embodiment, the following effects are obtained.

In the substrate connection structure in this embodiment, since the FPC 521R having a different direction is bent in the approximate U shape, it is possible to match the direction of the FPC 521R with the directions of the FPCs 521G and 521B. Thus, as the FPC 521R is bent in the approximate U shape, the length of the FPC 521R may be shortened compared with the lengths of the FPCs 521G and 521B. However, as the FPC 521R is connected to the relay substrate 600 and the extension FPC 700, it is possible to correct the shortened length and to make the length equal to the lengths of the FPCs 521G and 521B. Further, it is possible to efficiently perform connection to the third connector 820.

In the substrate connection structure according to this embodiment, even in a case where the direction of an electrode surface 523R of the connection terminal section 522R becomes reversed when the FPC 521R is bent, the direction of the electrode surface 523R can be made to match with the directions of the electrode surfaces 523G and 523B of the connection terminal sections 522G and 522B of the FPCs 521G and 521B (in this embodiment, is directed outward with reference to the cross dichroic prism 410) by the relay substrate 600. Accordingly, it is not necessary to twist the FPC 521R, and thus, it is possible to prevent fracture (specifically, fracture of the wiring formed on the FPC 521R) by stress due to twisting.

In the substrate connection structure according to this embodiment, the first connector 620 and the second connector 630 can be used as connectors having the same contact structure, and it is possible to prevent installation errors in an assembly process of the relay substrate 600, compared with a case where connectors having different contact structures are used.

In the substrate connection structure according to this embodiment, as three third connectors 820 are installed on the surface 811 which becomes the same surface as the driving circuit substrate main body 810, it is possible to efficiently connect three FPCs 521 (extension FPC 700 in the FPC 521R) to the corresponding three connectors 820 (820R, 820G and 820B), respectively, compared with a case where connectors are installed on different surfaces.

In the substrate connection structure according to this embodiment, the first connector 620, the second connector 630 and the third connectors 820 can have the same contact structure, and thus, it is possible to prevent installation errors in an assembly process, compared with a case where connectors have different contact structures. Further, as the connectors can be commonly used, it is possible to reduce the cost thereof.

In the substrate connection structure according to this embodiment, as the relay substrate main body 610 is formed of the rigid substrate and has stiffness compared with a case where it is formed of a flexible substrate, problems (separation or the like) with the relay substrate main body 610 hardly occur, even though the first connector 620 and the second connector 630 are installed (surface-mounted) on the surface of the relay substrate main body 610. Thus, it is possible to enhance connection workability and to maintain a preferable connection state.

According to the substrate connection structure in this embodiment, three reflective light modulating devices 52 (52R, 52G and 52B) can utilize the common configuration. Accordingly, it is not necessary to make the direction of the FPC 521R of the reflective light modulating device 52R different from the other two directions in order to match the direction of the FPC 521R of the reflective light modulating device 52R with the directions of the FPCs 521G and 521B of two reflective light modulating devices 52G and 52B, and thus, it is possible to reduce the manufacturing cost of the reflective light modulating device 52.

According to the projector 1 in this embodiment, in a case where three reflective light modulating devices (52R, 52G and 52B) are disposed around the cross dichroic prism 410, even though the direction of the FPC 521R is different from the directions of the other FPCs 521G and 521B, by providing the above-described substrate connection structure, it is possible to enhance connection workability, to maintain a preferable electric connection state, and to perform a stable projection.

The invention is not limited to the above-described embodiment, and various modifications can be applied in a range without departing the scope. Modifications will be described hereinafter.

Modification 1

In the substrate connection structure according to the embodiment, the optical device 5 employs the reflective light modulating devices 52. However, the invention is not limited thereto, and a transmissive light modulating device may be employed. Further, the light modulating element to which the above-described substrate connection structure can be applied is not limited to the reflective or transmissive liquid crystal display panel, and for example, may be applied to a light modulating device of a different type such as a digital micro mirror device.

Modification 2

The substrate connection structure according to the embodiment is applied to the FPC 521R of the R light reflective light modulating device 52R, but the invention is not limited thereto. The invention may be applied to the FPCs 521G and 521B of the G light and B light reflective light modulating devices 52G and 52B.

Modification 3

In the substrate connection structure according to the embodiment, the optical device 5 employs a so-called 3-plate type which uses three reflective light modulating devices 52R, 52G and 52B corresponding to R light, G light and B light. However, the invention is not limited thereto, and a light modulating device for enhancing contrast may be added. Further, the substrate connection structure according to this embodiment may be applied to a flexible substrate of the light modulating device for enhancing the contrast.

Modification 4

In the optical unit 4 of the embodiment, a lens integrator optical system made up of the first lens array 210 and the second lens array 220 is employed as the illumination optical device 200 which uniformizes the illumination intensity of the light flux emitted from the light source device 100, but the invention is not limited thereto. A rod integrator optical system including a light guiding rod may be employed.

Modification 5

In the optical unit 4 of the embodiment, the light source lamp 111 of the light source device 100 employs the discharge lamp such as an extra high pressure mercury lamp, but a variety of solid light emitting elements such as a laser diode, an LED (Light Emitting Diode), an organic EL (Electro Luminescence) element, or a silicon light emitting element may be employed.

Modification 6

Figure 5:
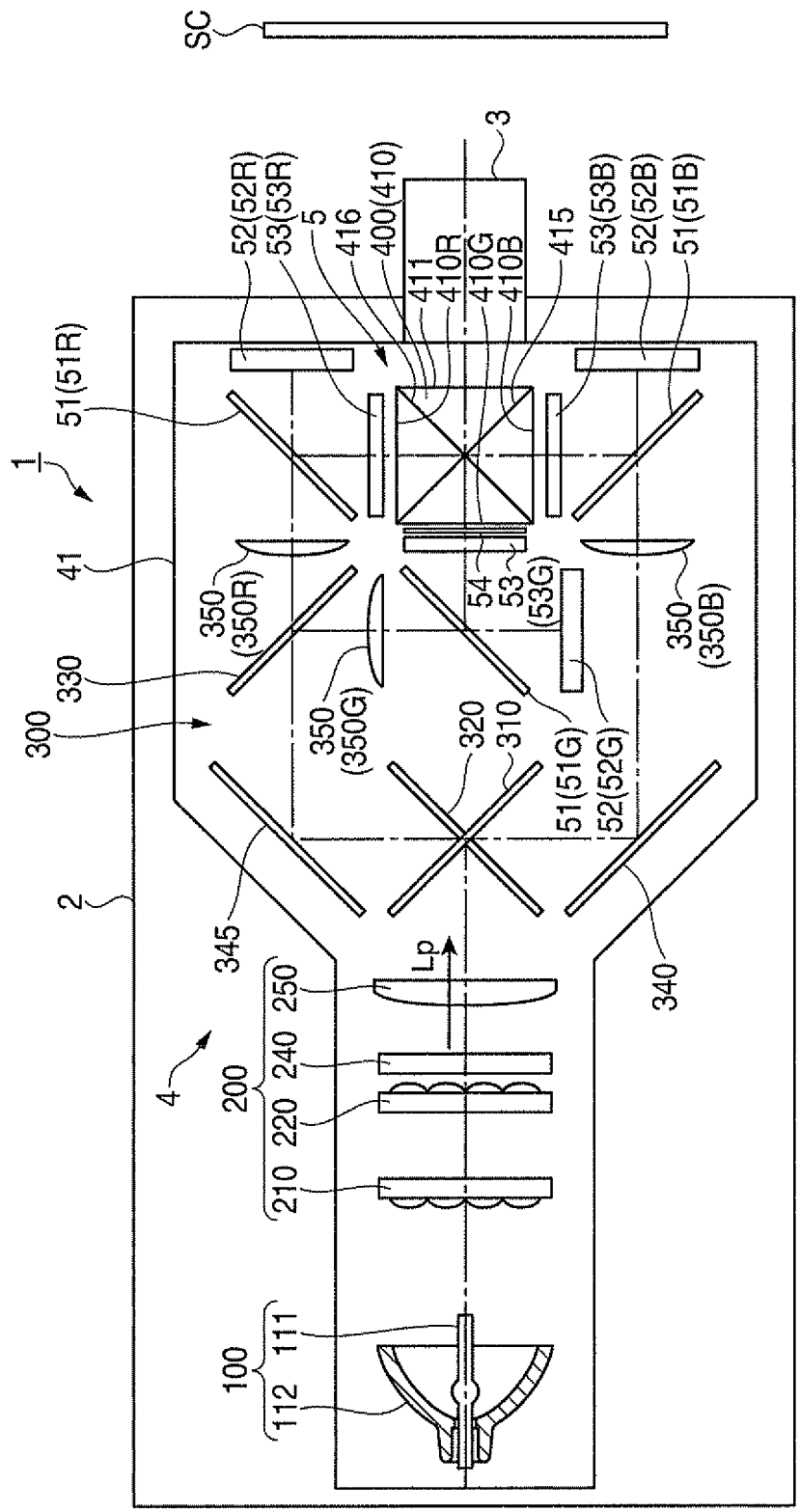
FIG. 5 is a diagram schematically illustrating a configuration of a projector according to a modification.

In the embodiment, the configuration of the illumination optical device 200 including the polarization conversion element 240 which emits the light flux Ls which is the S polarization light is exemplified, but as shown in FIG. 5, the illumination optical device 200 may have a configuration having the polarization conversion element 241 which emits the light flux Lp in which the polarization direction is aligned as the P polarization light. In this case, it is not necessary to install the phase difference plate 360 installed on the emitting side of the collimating lens 350 which forms the color splitting optical device 300.

What is claimed is:

1. A substrate connection structure between a plurality of light modulating devices each having a flexible substrate extending in a predetermined direction and a circuit substrate connected with the light modulating devices,
wherein the light modulating devices are arranged so that the direction of one flexible substrate extending from at least one of the light modulating devices is different from the directions of the other flexible substrates extending from the other light modulating devices,
the substrate connection structure comprising:
a relay substrate which is connected with the one flexible substrate; and
an extension flexible substrate which is connected with the relay substrate,
wherein the circuit substrate includes a plurality of third connectors which are respectively connected with the extension flexible substrate and the other flexible substrates, and
wherein the third connectors are installed on the same surface of the circuit substrate.

2. The substrate connection structure according to claim 1, wherein the relay substrate includes:
a first connector which is connected with the one flexible substrate and holds the one flexible substrate;
a second connector which is connected with the extension flexible substrate and holds the extension flexible substrate; and
a relay substrate main body on which a wiring which conductively connects the first connector and the second connector is formed, wherein the first connector is installed on one surface of the relay substrate main body and the second connector is installed on the other surface of the relay substrate main body.

3. The substrate connection structure according to claim 1, wherein the relay substrate main body is formed of a rigid substrate.

4. A projector comprising:

the substrate connection structure according to claim 1; and a color composition optical device which composes optical images emitted from the light modulating devices and emits the composed result.

5. A manufacturing method of a projector, comprising:

preparing a plurality of light modulating devices each having a flexible substrate extending in a predetermined direction;

preparing a circuit substrate connected with the light modulating devices;

arranging the light modulating devices so that the direction of one flexible substrate extending from at least one of the light modulating devices is different from the directions of the other flexible substrates extending from the other light modulating devices, connecting a relay substrate with the one flexible substrate;

connecting an extension flexible substrate with the relay substrate;

connecting the flexible substrates and the relay substrate with the circuit substrate; and installing a plurality of third connectors which are respectively connected with the extension flexible substrate and the other flexible substrates, on the same surface of the circuit substrate.

6. The method according to claim 5, wherein the relay substrate includes:

a first connector which is connected with the one flexible substrate and holds the one flexible substrate;

a second connector which is connected with the extension flexible substrate and holds the extension flexible substrate; and a relay substrate main body on which a wiring which conductively connects the first connector and the second connector is formed, the method further comprising:

installing the first connector on one surface of the relay substrate main body; and installing the second connector on the other surface of the relay substrate main body.

7. The method according to claim 5, further comprising:

forming the relay substrate main body of a rigid substrate.

* * * * *